(12) United States Patent
Okita et al.

(10) Patent No.: US 6,819,045 B2
(45) Date of Patent: Nov. 16, 2004

(54) DISPLAY DEVICE

(75) Inventors: Hiroyuki Okita, Kanagawa (JP); Junichi Ohsako, Tokyo (JP); Kazuhito Shimoda, Kanagawa (JP)

(73) Assignee: Sony Corporation, Tokyo (JP)

( * ) Notice: Subject to any disclaimer, the term of this patent is extended or adjusted under 35 U.S.C. 154(b) by 449 days.

(21) Appl. No.: 09/947,703

(22) Filed: Sep. 6, 2001

(65) Prior Publication Data

US 2002/0071082 A1 Jun. 13, 2002

(30) Foreign Application Priority Data

Sep. 7, 2000 (JP) ..................................... P2000-272237

(51) Int. Cl.$^7$ .......................... H05B 33/00; H05B 33/08
(52) U.S. Cl. ......................... 313/511; 313/512; 439/67; 439/77; 439/329; 349/150
(58) Field of Search ........................... 439/67, 77, 329; 349/150; 313/511, 512

(56) References Cited

U.S. PATENT DOCUMENTS

| | | | | |
|---|---|---|---|---|
| 4,862,153 A | * | 8/1989 | Nakatani et al. | ............ 313/511 |
| 5,003,222 A | * | 3/1991 | Washo | ........................ 313/511 |
| 2002/0030440 A1 | * | 3/2002 | Yamazaki | ................... 313/503 |
| 2002/0031602 A1 | * | 3/2002 | Zhang | .......................... 257/88 |
| 2002/0180344 A1 | * | 12/2002 | Lichtfuss | .................... 313/498 |
| 2003/0020844 A1 | * | 1/2003 | Albert et al. | .................. 345/33 |
| 2003/0038590 A1 | * | 2/2003 | Silverbnail et al. | ......... 313/504 |

\* cited by examiner

*Primary Examiner*—Nimeshkumar D. Patel
*Assistant Examiner*—Mariceli Santiago
(74) *Attorney, Agent, or Firm*—Sonnenschein, Nath & Rosenthal LLP

(57) ABSTRACT

A display device comprises a display pail having a flexible panel substrate serving as a display elements disposed lengthwise and breadthwise on a surface opposite to the display screen of the panel substrate; and driving circuit parts having flexible driving circuit substrates on which semiconductor elements made of flexile semiconductor materials are mounted. Accordingly, the completely flexible display device in which not only the display part, but also the driving circuit parts have flexibility can be provided.

22 Claims, 11 Drawing Sheets

DISPLAY DEVICE

RELATED APPLICATION DATA

The present application claims priority to Japanese-Application(s) No(s). P2000-272237 filed Sep. 7, 2000, which application(s) is/are incorporated herein by reference to the extent permitted by law.

BACKGROUND OF THE INVENTION

1. Field of the Invention

The present invention relates to a display device in which a display part and a driving circuit part are flexible.

2. Description of the Related Art

After a display device such as a monitor or a television or the like is disposed at a prescribed position, the display device has not been hitherto frequently moved and it has not been impossible to accommodate the display device with its volume reduced and carry and move it.

Then, in recent years, with the enlargement of a screen of a display, that is, with the progress of a large monitor or television, the device itself has been progressively enlarged and its weight has been increased so as to meet the increase of the amount of information and comfortableness, it may be said that the above mentioned usage of the display device is not substantially performed.

On the other hand, a notebook type personal computer or a liquid crystal television or the like has been designed to decrease a space occupied by it and its weight in accordance with the technological advancement. This is different from the above described usage in view of conception. Further, the space has not been saved or the weight has not reduced enough to permit the above mentioned usage.

For instance, Japanese Patent Application Laid-open No. hei 2-251429 or Japanese Patent Application Laid-open No. hei 6-124785 disclose that a polymer film is used as a substrate to manufacture an organic EL (electroluminescence) element with flexibility for manufacturing the display device. However, in the present condition, the organic EL element disclosed in these publications simply serves to apply the flexibility only to the display part of the display device and an electrode drawn from the display part is connected to a driving circuit substrate on which a hard semiconductor element is mounted, so that an entire display device has not undesirably had a flexibility. Thus, it is currently demanded to realize a completely flexible display device in which not only the display part, but also a driving circuit part is provided with the flexibility.

SUMMARY OF THE INVENTION

Accordingly, the present invention is created on the basis of a completely new conception free of the idea of a conventional display device and it is an object of the present invention to provide a completely flexible display device in which not only a display part, but also a driving circuit part is flexible.

According to the present invention, there is provided a display device comprising: a display part having a flexible panel substrate serving as a display screen and display elements disposed lengthwise and breadthwise on a surface opposite to the display screen of the panel substrate; and driving circuit parts having flexible driving circuit substrates on which semiconductor elements made of flexible semiconductor materials are mounted.

In the display device according to the present invention configured as described above, the display part is provided with the display elements on the flexible panel substrate. Thus, in the display device, the display part is considered to flexible.

Further, in the display device, the driving circuit parts are provided with the flexible driving circuit substrates on which the flexible semiconductor elements formed of the flexible semiconductor materials are mounted. Thus, in this display device, the driving circuit parts are considered to be flexible.

Therefore, since both the display part and the driving circuit parts are flexible in the display device according to the present invention, the entire body of the display device is completely flexible.

BRIEF DESCRIPTION OF THE DRAWINGS

Other characteristics will appear on reading the description which follows in reference to the attached drawings in which.

DETAILED DESCRIPTION OF THE PREFERRED EMBODIMENTS

Now, embodiments of the present invention will be described by referring to the accompanying drawings.

Figure 1:
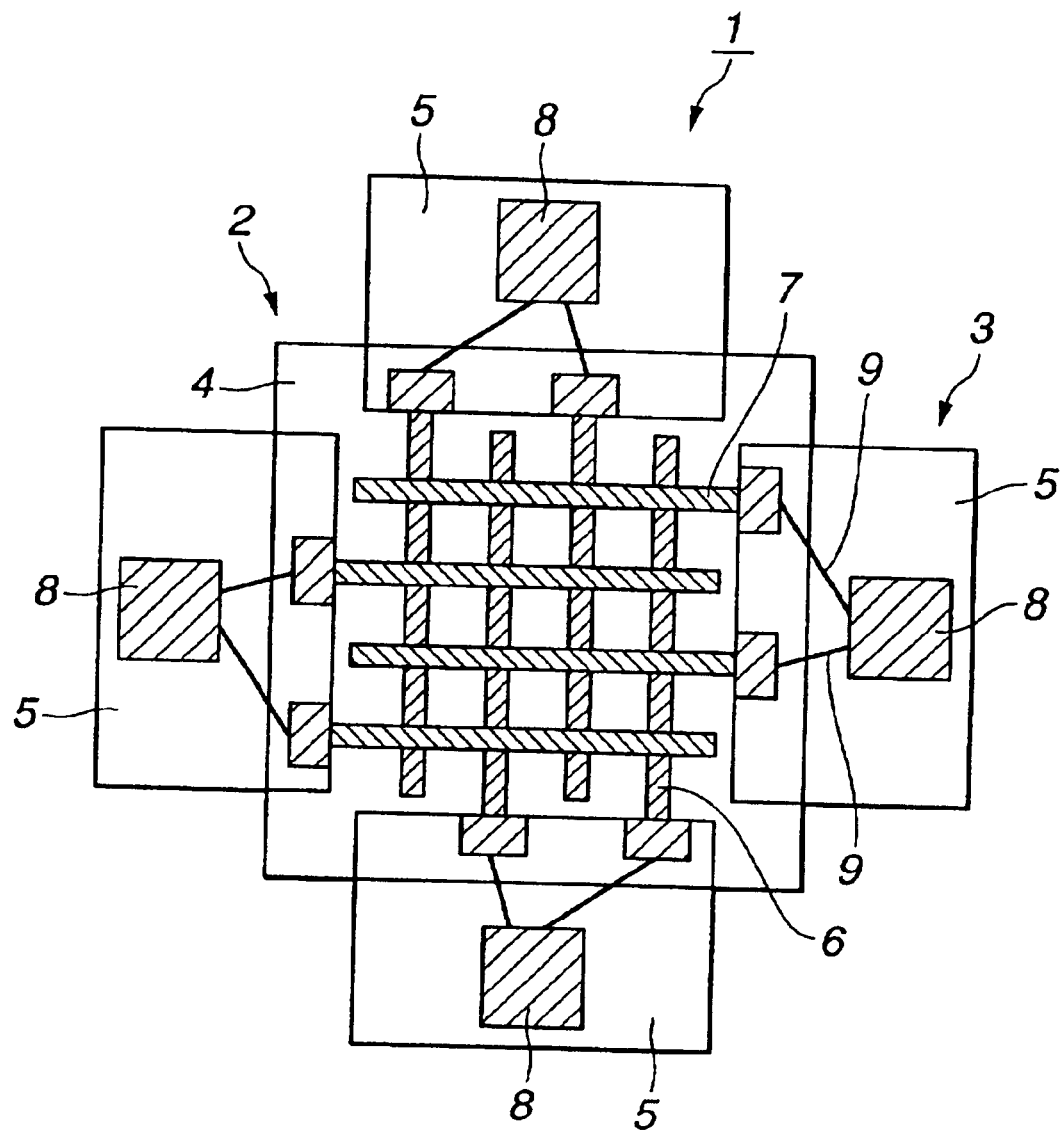
FIG. 1 is a back view of an organic EL (electro luminescence) display to which the present invention is applied.

In FIG. 1, one constructional example of a display device to which the present invention is applied will be described below. In this specification, an organic EL (electroluminescence) display 1 using organic EL (electroluminescence) elements as display elements will be explained as an example.

The organic EL display 1 serves to display an image or the like. The organic EL display 1 comprises a display part 2 provided with organic EL elements on a flexible panel substrate 4 and driving circuit parts 3 for outputting image signals to drive the display part 2 and having flexible driving circuit substrates 5 on which semiconductor elements 8 are mounted. The display part 2 and the driving circuit parts 3 are bonded to the panel substrate 4 while the peripheral outer edges of the former are partly superimposed on those of the latter. Generally, the entire body of the driving circuit substrates on which the semiconductor elements are mounted is called TAB (tape automated bonding) as a popular name. The organic EL display 1 is what is called a passive matrix system display that the organic EL elements are arranged lengthwise and breadthwise in a simple grid form. The passive matrix system has a configuration that the organic EL elements are formed between two electrodes intersecting at right angles and a driving system that each organic EL element functions as both a display element and a switching element. These organic EL elements are arranged in a simple grid form on the panel substrate 4 as a panel and driving wires are arranged lengthwise and breadthwise, that is, longitudinal wires 6 and transverse wires 7 are arranged. These driving wires are electrically connected to the semiconductor elements 8 through connecting wires 9 printed on the flexible driving circuit substrates 5. The organic EL elements are driven by supplying a driving current thereto from the driving circuit substrates 5.

In the organic EL display 1, the driving circuit parts 3 employs the flexible driving circuit substrates 5 as the driving circuit substrates 5. The flexible semiconductor elements 8 are mounted on the flexible driving circuit substrates 5. That is, the flexible semiconductor elements 8 are mounted on the flexible driving circuit substrates 5 so that the driving circuit parts 3 are made flexible.

As described above, since the flexible semiconductor elements 8 are mounted on the flexible driving circuit substrates 5 to form the driving circuit parts 3, the driving circuit parts 3 themselves can be made flexible due to the flexibility provided in the flexible driving circuit substrates 5 and the flexible semiconductor elements 8, which is different from a case in which a conventional substrate using glass or an epoxy resin or the like is used as a substrate for mounting a semiconductor element thereon and a hard semiconductor element made of Si or the like is mounted on the substrate. Then, the driving circuit parts 3 themselves are made flexible, so that various types of usages can be adopted, for example, the driving circuit parts 3 can be housed by making them round.

Further, the organic EL display 1 using the flexible driving circuit substrates 5 according to the present invention is hardly broken even when it is dropped or undergoes an external impact. Therefore, an impact resistance of the organic. EL display to the external impact can be extremely improved.

In this case, as the flexible driving circuit substrate 5, a film type metal substrate, a film type plastic substrate, or the like having a desired flexibility may be preferably employed.

As materials used for the film type metal substrate, may be employed any metal such as stainless steel, Fe, Al, Ni, Co, Cu or alloys thereof which may be brought to a film stale under ambient temperature and ambient pressure. In this case, when the film type metal substrates are used as the flexible driving circuit substrates, the driving circuit substrates need to be assuredly insulated from the semiconductor elements.

As materials used for the film type plastic substrate, for instance, polyethylene terephthalate (PET), polyethylene naphthalate (PEN), polyether sulfone (PES), polyolefine (PO), or the like may be preferably employed.

Further, the flexible driving circuit substrates 5 may be combined with a power supply. Namely, as the flexible driving circuit substrate 5, a sheet type polymer battery may be utilized. The sheet type polymer battery is used as the flexible driving circuit substrate 5, so that power can be taken from the substrate. Accordingly, the power supply may not be separately provided to effectively save a space and improve portability.

The flexible semiconductor element 8 may be formed by using, for instance, an organic semiconductor material with a flexibility. As such materials, for instance, pentacene or polyacetylene, or the like may be exemplified. The organic semiconductor with the flexibility is employed as described above, hence a desired flexibility can be applied to the semiconductor element. Thus, the flexible semiconductor element which has not been hitherto realized can be formed.

As materials of the driving wires, that is, the longitudinal wires 6 and the transverse wires 7, and the connecting wires 9 for connecting the driving wires to the semiconductor elements, for instance, materials low in specific resistance and chemically stable such as Au, Cr, Al, Cu, or the like may be exemplified.

In the organic EL display 1 of the present invention, the display part 2 employs a flexible panel substrate 4 as the panel substrate 4 and the organic EL elements are formed on the flexible panel substrate 4. In other words, the organic EL elements are formed on the flexible panel substrate 4 so that the flexibility is applied to the display part 2 in this organic EL display 1.

Since the flexible panel substrate 4 is used as the panel substrate 4 in this organic EL display 1, the display part 2 itself is also flexible. Specifically, since the flexible panel substrate 4 is employed as the panel substrate 4 in this organic EL display 1, the display part 2 itself can be made flexible, which is different from a case in which a glass plate or the like has been heretofore used as the panel substrate. Then, the display part 2 itself can be made flexible due to the flexibility of the flexible panel substrate 4. Thus, the flexibility is given to the display part 2, so that various kinds of use forms may be adopted, for example, the display part 2 may be accommodated by making it round.

The flexible panel substrate 4 is not easily broken nor shows brittleness like a glass substrate. Therefore, the organic EL display 1 using such a flexible panel substrate 4 is not easily cracked owing to an external impact such as a fall, that is, not easily broken, which is different from the conventional organic EL element using the glass substrate, and accordingly, the impact resistance to the external impact can be greatly improved.

Further, in the organic EL display 1, since the flexible panel substrate 4 is employed as the panel substrate 4, the weight of this organic display EL display 1 is reduced more greatly than that of the conventional organic EL display using the glass substrate. Thus, for instance, even when a large display or the like is formed, the weight of a device can be reduced, so that the degree of freedom in designing the device can be increased.

Here, as the flexible panel substrate 4, may be preferably employed a film type metal substrate having a desired flexibility, a film type plastic substrate or a substrate having a gas barrier layer formed on the surface of the film type plastic substrate or the like.

As materials used for the film type metal substrate, for instance, any metal such as stainless steel, Fe, Al, Ni, Co, Cu or alloys thereof which can be brought to a film state under ambient temperature and ambient pressure may be employed.

As materials used for the film type plastic substrate, there may be preferably used, for instance, polyethylene terephthalate (PET), polyethylene naphthalate (PEN), polyether sulfone (PES), polyolefine (PO), or the like. It is to be understood that the materials used for the film type plastic substrate are not limited thereto and any material which is transparent and good in its optical characteristics may be employed.

In the organic EL display 1 configured as described above, since both the driving circuit parts 3 and the display part 2 are made flexible as mentioned above, a completely flexible organic EL display is realized. Thus, various kinds of using forms may be adopted, for instance, the driving circuit parts 3 and the display part 2 may be accommodated by making them round. For example, the driving circuit substrates 5 may be bent so as to be hidden in the back surface of the display part 2. Thus, a space occupied by the driving circuit parts 3 can be eliminated and the display device can be made compact.

Further, in the organic EL display 1, since the flexible substrates and the flexible panel substrate 4 are employed as the driving circuit substrates 5 and the panel substrate 4 of the display part 2 as described above, the display 1 is hardly broken even it undergoes an external impact such as a fall. Accordingly, an impact resistance of the display to the external impact can be greatly improved.

Still further, in the organic EL display 1, since the flexible substrates and the flexible panel substrate 4 are employed as the driving circuit substrates 5 and the panel substrate 4 of the display part 2 as mentioned above, this organic EL display 1 is more greatly lightened in its weight than the conventional organic EL display using a glass substrate or the like. Accordingly, for instance, even when a large display is formed, the weight of the device can be decreased. Thus, the degree of freedom in designing the device can be increased.

In the above embodiment, although the connecting wires 9 are printed on the flexible driving circuit substrates 5, it is to be recognized that the connecting wires 9 are not limited thereto, and may be composed of, for instance, flexible cables.

Figure 2:
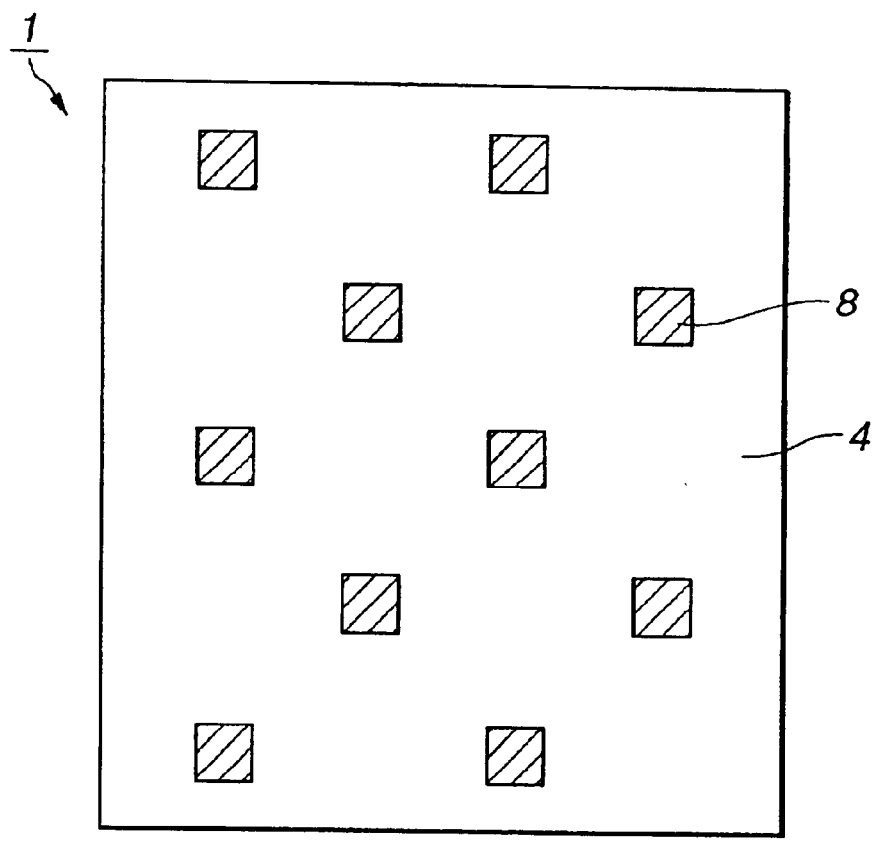
FIG. 2 is a plan view showing a state in which flexible semiconductor elements are directly mounted on the back surface of a display part.

Further, in the above described embodiment, although the driving circuit substrates 5 on which the flexible semiconductor elements 8 are mounted are connected to the back surface of the display part 2, it is to be understood that only the semiconductor elements 8 may be directly mounted on the back surface of the display part 2 as shown in FIG. 2 without using the driving circuit substrates 5. In this case, wires for connecting each semiconductor element 8 are provided in the back surface of the display part 2 to realize the above described function.

Still further, in the above described embodiment, although the display part 2 is formed by the passive matrix, it is to be noted that the present invention is not limited thereto, and the display part 2 may be formed by the active matrix. In this case, a flexible TFT (thin film transistor) may be attached to each element. The flexible TFT can be formed by using the above described flexible organic semiconductor material.

Figure 3:
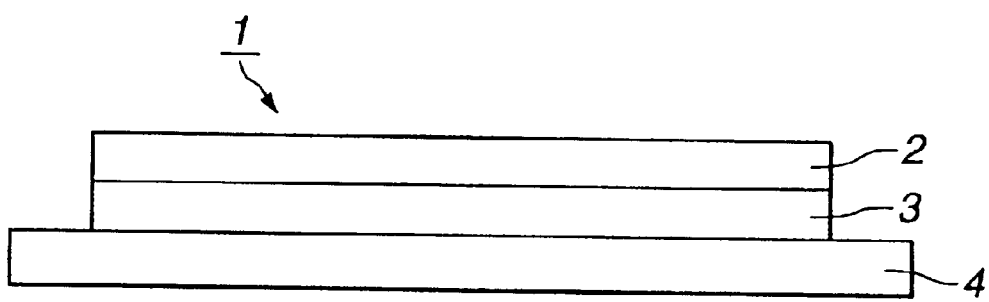
FIG. 3 is a longitudinally sectional view showing a state in which the display part and a driving circuit part are formed on the same flexible panel substrate.

Further, as an alternative example, the display part 2 and the flexible driving circuit part 3 may be formed on one flexible substrate. In this case, the driving circuit part 3 provided with the semiconductor elements 8 made of the flexible semiconductor materials may be initially formed on the flexible panel substrate 4 as shown in FIG. 3 and the display part 2, that is, the organic EL elements or wires may be formed thereon. Here, as materials for forming the flexible semiconductor elements 8, for instance, pentacene or polyacetylene or the like may be utilized. Since the display device has the above described construction, even when the display device itself is repeatedly bent or curved, the display device excellent in its durability, that is, having a high reliability can be configured.

Figure 4:
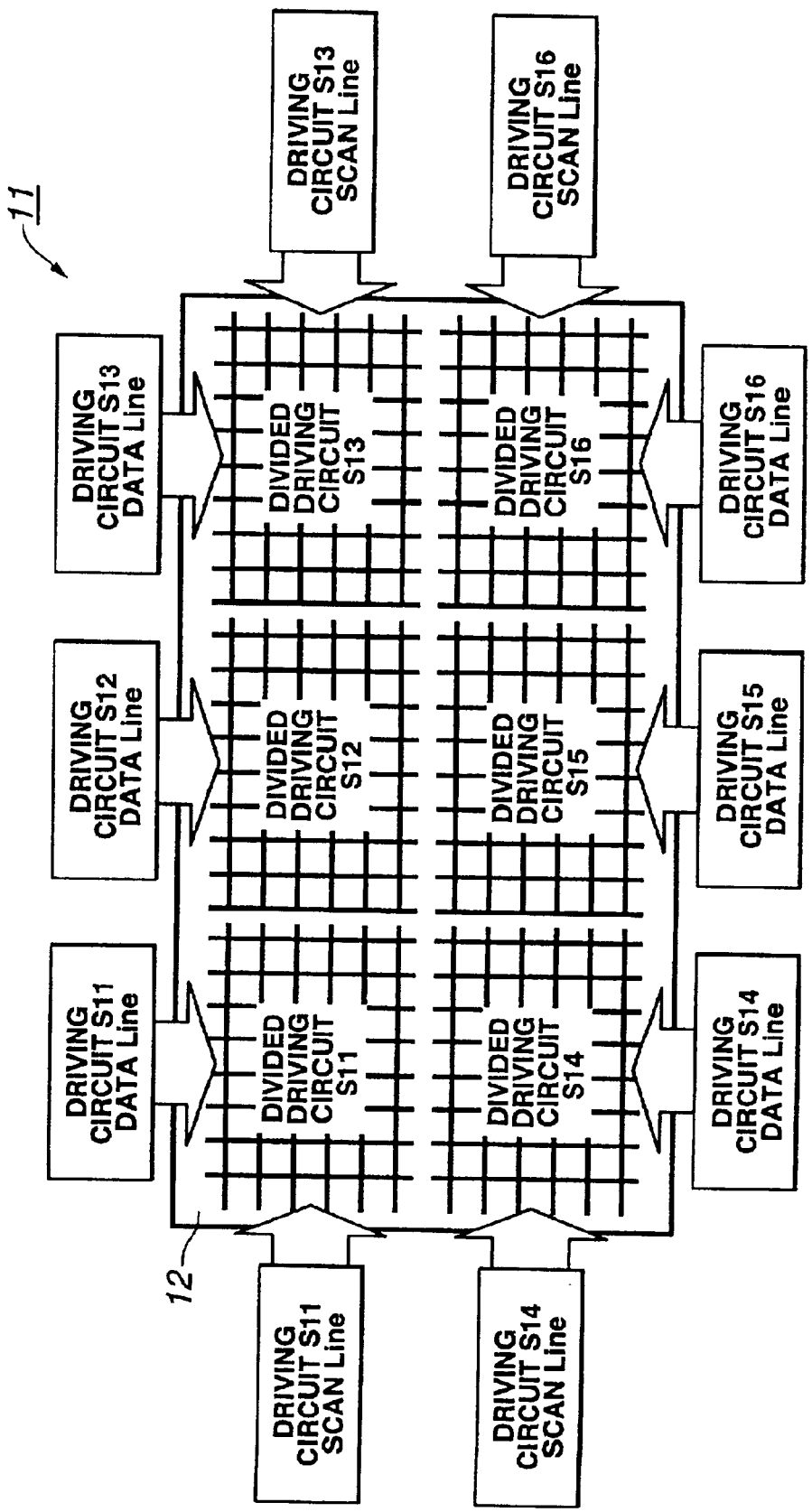
FIG. 4 is a plan view schematically showing one constructional example of an organic EL display to which the present invention is applied and a state in which a driving circuit is divided into a plurality of driving circuits on a panel substrate.
Figure 5:
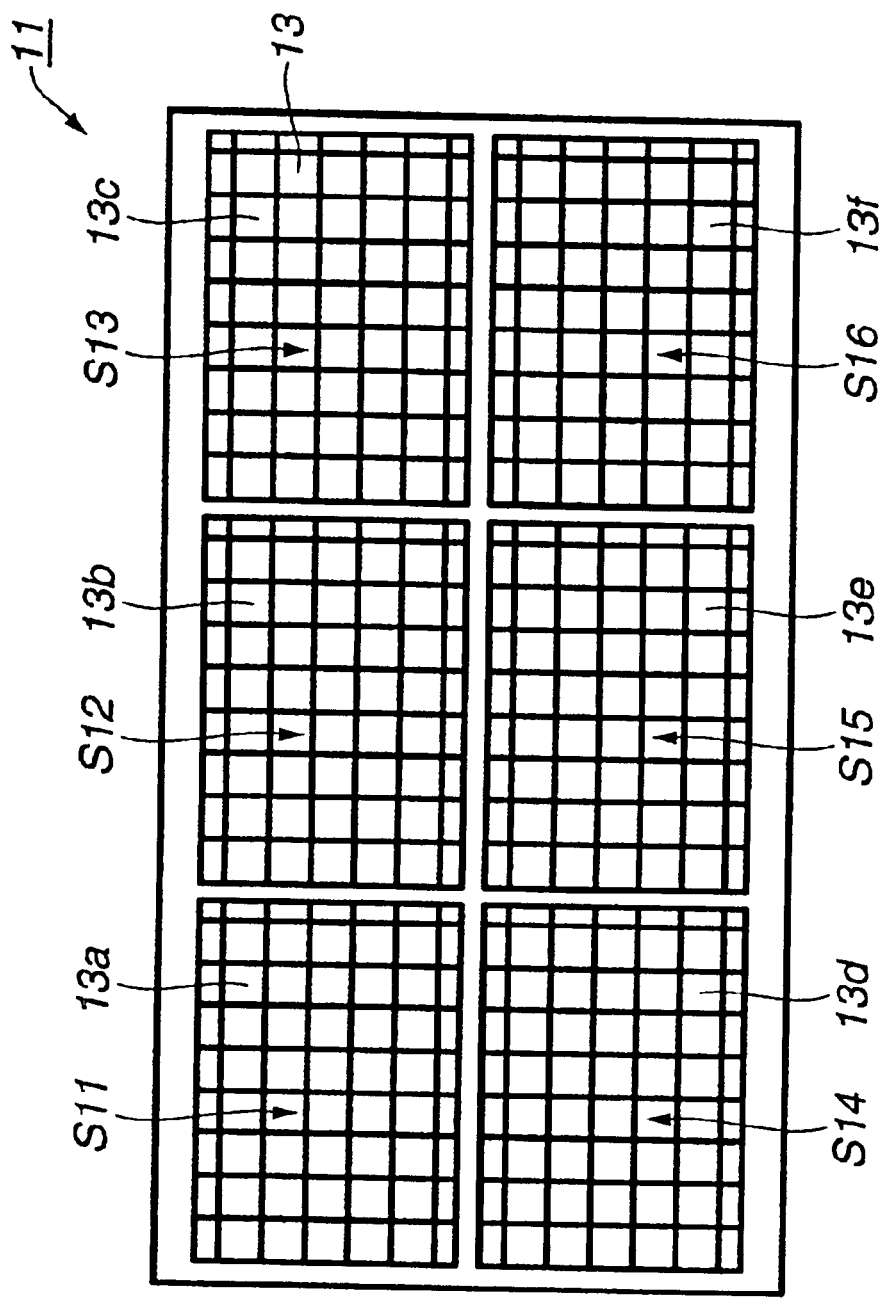
FIG. 5 is a plan view schematically showing one constructional example of an organic EL display to which the present invention is applied and a state in which driving circuit substrates are arranged on the divided driving circuit areas.

Now, another embodiment of a display to which the present invention is applied will be described below. FIGS. 4 and 5 schematically show the constructional form of another embodiment of the display to which the present invention is applied. In this case, an organic EL display using organic EL elements as display elements will be described as one example.

The organic EL display 11 of another embodiment of the present invention employs the organic EL elements as the display elements and is what is called a passive matrix system display that the organic EL elements are arranged in a simple grid form lengthwise and breadthwise similarly to the above described embodiment. These organic EL elements are arranged in a simple grid form on a panel substrate 12 serving as a panel. Further, driving wires (data lines and scan lines) are arranged lengthwise and breadthwise. These organic EL elements are driven by a driving current supplied from driving circuit substrates attached to a surface opposite to the panel substrate 12.

In this organic EL display 11, driving circuit parts employs flexible driving circuit substrates 13 as driving circuit substrates 13 like the above described embodiment. Flexible semiconductor elements are mounted on the flexible driving circuit substrates 13. That is, the flexible semiconductor elements are mounted on the flexible driving circuit substrates 13, so that the driving circuit parts are made flexible in the organic display 11.

Further, in the organic EL display 11, a display part employs a flexible panel substrate 12 as a panel substrate 12 similarly to the above described embodiment. On the flexible panel substrate 12, the organic EL display elements are formed, so that the display part is flexible in this organic EL display 11.

In this organic EL display 11, one large driving circuit substrate corresponding to the size of the panel substrate 12 is not arranged on the entire surface of the panel as the driving circuit substrate 13, but the panel substrate 12 is divided into several driving circuit areas by the driving wires for driving the display elements disposed on the panel substrate 12. Then, a plurality of driving circuit substrates 13 finely divided so as to correspond to the respective driving circuit areas are employed. In the organic EL display 11 shown in FIG. 4, is illustrated an example that the panel to which the organic EL elements are attached is divided into six driving circuit areas S11 to S16. FIG. 5 shows an example that the six driving circuit substrates 13a to 13f are disposed in the divided driving circuit areas S11 to S16 so as to correspond to the respective areas. These finely divided driving circuit substrates 13a to 13f are connected together by a cascade connection method. In the following description, the driving circuit substrates 13a to 13f are sometimes generally called a driving circuit substrate 13.

On these driving circuit substrates 13, the driving circuit semiconductor elements of the organic EL elements are mounted and there are provided terminals to be connected to the terminals of the organic EL elements through, for instance, bumps by holes passing through the driving circuit substrates 13.

As the number of terminals of the driving circuit substrates 13, at least one terminal is required for one driving wiring (data line and scan line) and a plurality of connecting terminals are desirably provided. A plurality of terminals for bumps are provided so that the reliability of a bump connection can be enhanced.

Figure 12:
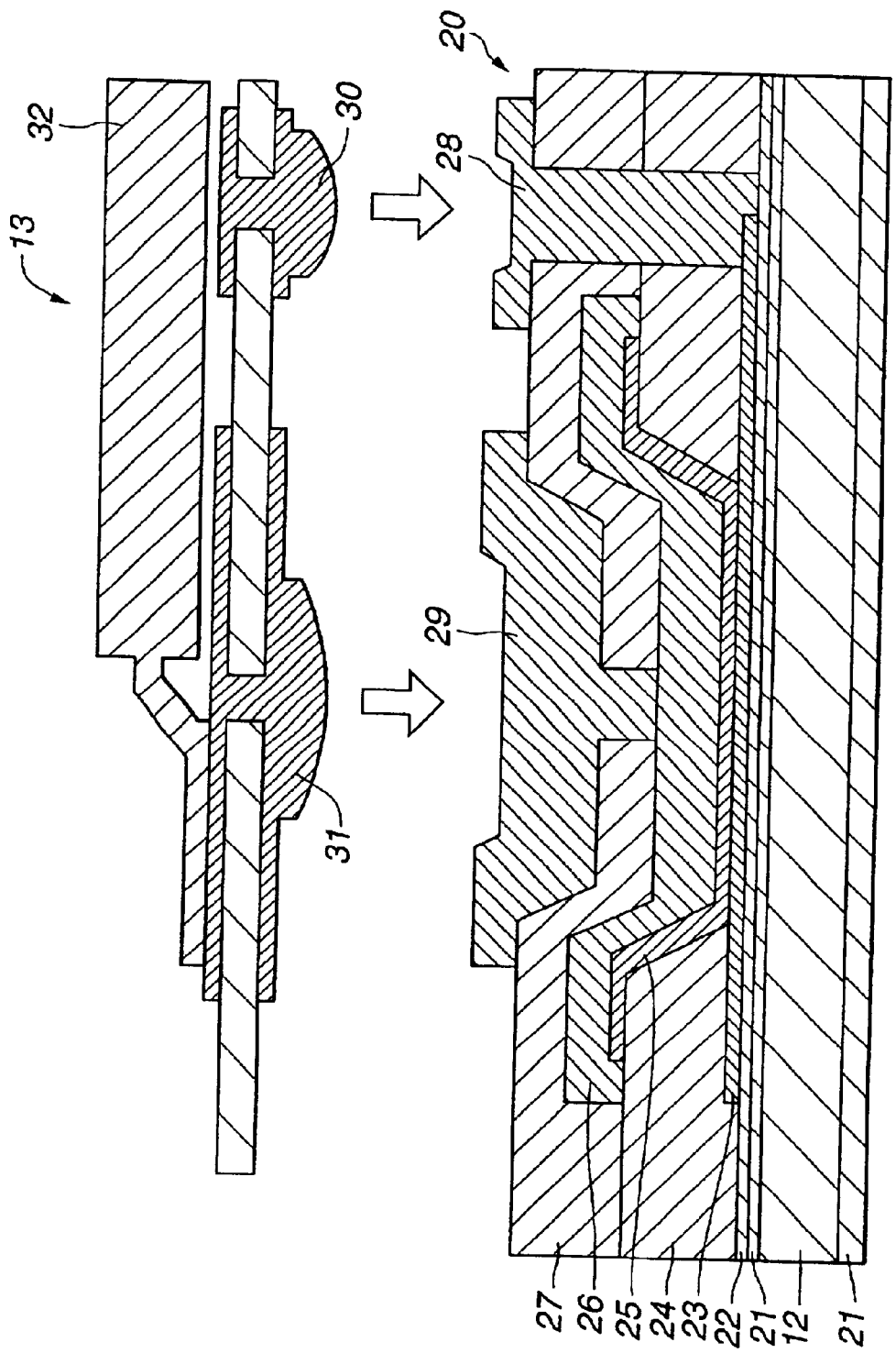
FIG. 12 is a longitudinally sectional view showing a state in which the driving circuit substrate is arranged in the back side of the organic EL element to which the present invention is applied.

As specifically described below, a data line terminal 30 and/or a scan line terminal 31 provided on the driving circuit substrate 13 are respectively connected to a first electrode 28 and a second electrode 29 provided in the organic EL element 20 by means of bumps or the like as shown in FIG. 12. Then, an element driving current is transmitted to the organic EL element from the driving circuit substrate 13 to drive the organic EL element 20. As described above, the electrode terminal is taken out from not the side of a display screen but from the back side thereof, so that the organic EL display 11 with a large screen can be realized in a passive matrix system.

Further, since the driving circuit substrate 13 is finely divided into a plurality of areas, a management and a repair may be performed for each area so that the quality of the organic EL display 11 can be maintained. For example, when a failure of the driving circuit of the display element is generated, the part in which the failure is generated cannot be repaired in the conventional display of the active matrix system using the TFT and the light emission in that part is not obtained to have a dark point. On the other band, in the organic EL display 11 of the present invention, even when the trouble is generated in the driving circuit of the organic EL element, each area can be repaired so that the dark point is not generated in the organic EL display 11 to continuously maintain its excellent quality.

Figure 6:
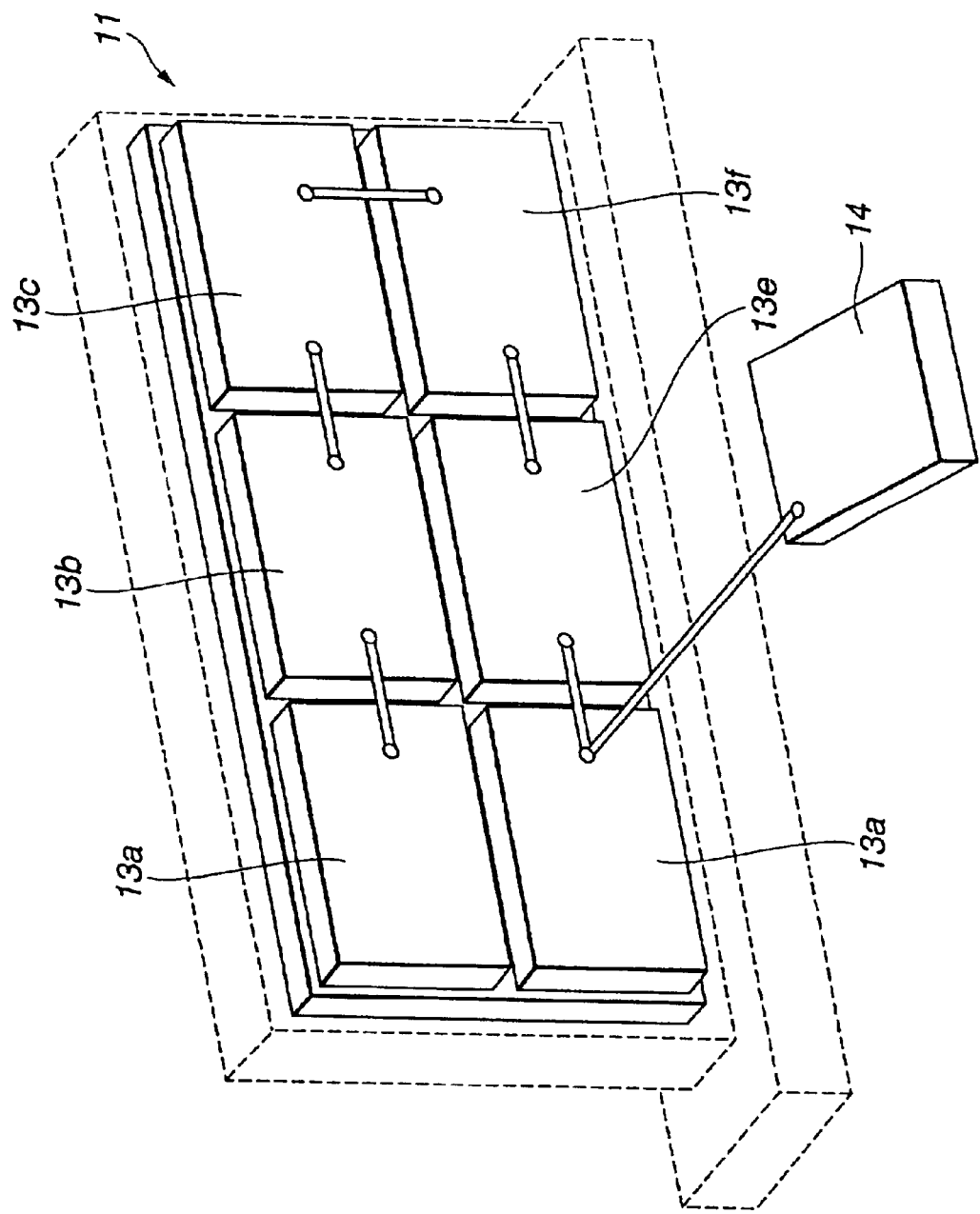
FIG. 6 is a perspective view showing a state in which a plurality of driving circuit parts are connected by a cascade connection method.

As described above, the driving circuit substrates 13a to 13f finely divided in the panel are connected together by a cascade connection method. As shown in FIG. 6, a driving current is supplied to the organic EL elements in accordance with an image signal or a video signal transmitted to the driving circuit substrates 13a to 13f from an externally connected image transfer device 14 to drive the organic EL elements and display an image or a screen image on the display screen of the organic EL display 11.

(Explanation of Organic EL Element)

Now, the constructional example of an organic EL element mounted on the organic EL display 11 to which the present invention is applied will be described below.

Figure 7:
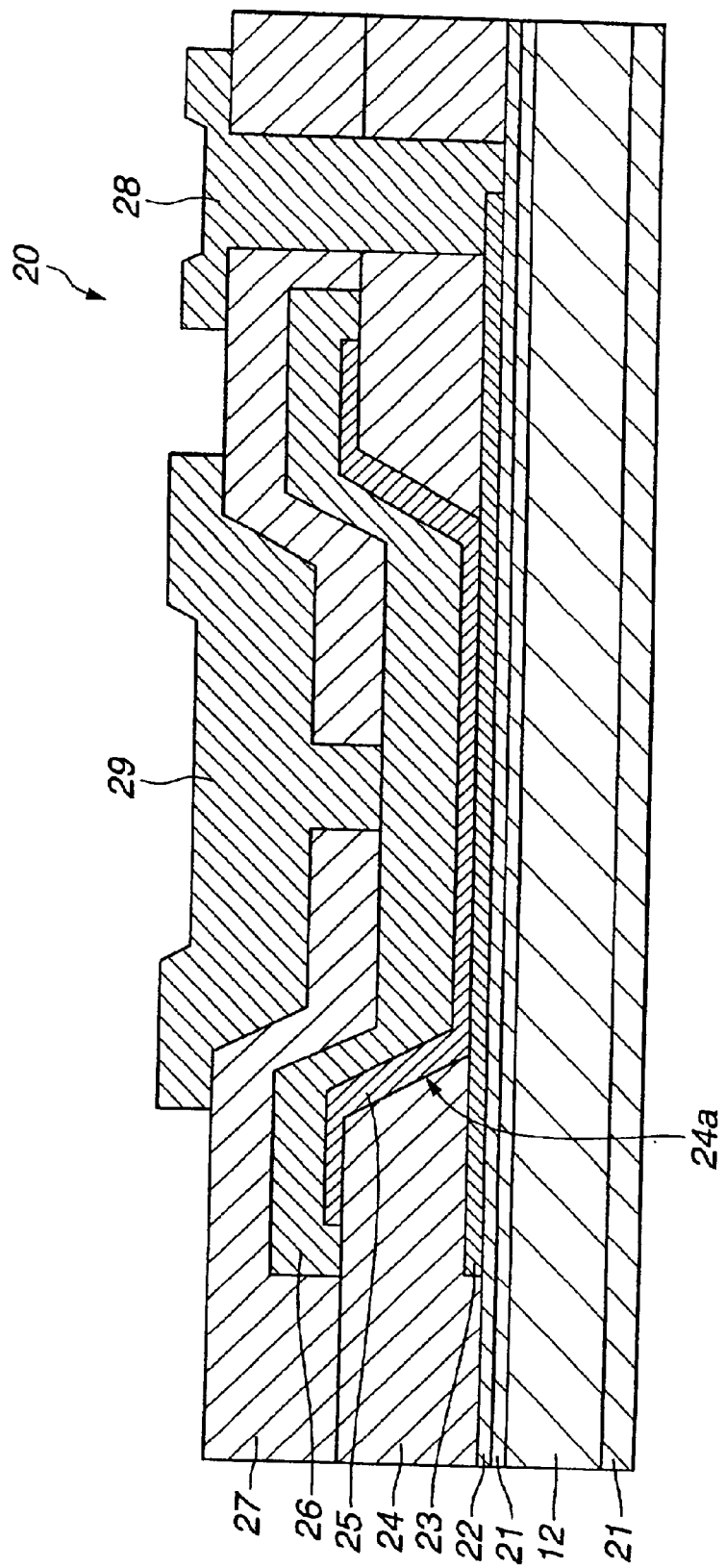
FIG. 7 is a sectional view showing one constructional view of an organic EL element employed for the organic EL display to which the present invention is applied.

The organic EL element 20 comprises, as shown in FIG. 7, a flexible panel substrate 12 having gas barrier films 21 formed on both surfaces, an electrode film 22 formed on one surface of the panel substrate 12, a transparent electrode film 23 formed on the electrode film 22, a first insulating film 24 formed on the transparent electrode film 23, an organic EL film 25 formed on the first insulating film 24 and the transparent electrode film 23, a metal electrode film 26 formed on the organic EL film 25 and a second insulating film 27.

As the flexible panel substrate 12, a film type plastic substrate having a good flexibility, a film type plastic substrate having a gas barrier layer on the surface thereof, a film type metal substrate or the like may be preferably employed.

As materials used for the film type plastic substrate, may be preferably used, for example, polyethylene terephthalate (PET), polyethylene naphthalate (PEN), polyether sulfone (PES), polyolefine (PO), or the like. Further, it is to be understood that the materials used for the film type plastic substrate are not limited to these materials, and any material which is transparent and has excellent optical characteristics may be employed.

As materials used for the film type metal substrate, any metal, for instance, stainless steel, Fe, Al, Ni, Co, Cu or alloys thereof which can be brought to a film state under ambient temperature and ambient pressure can be employed. When the film type metal substrate is used as the panel substrate 12, the configuration of the organic EL element 20 is reverse to that described above.

In the organic EL element 20 shown in FIG. 7, the gas barrier films 21 composed of, for instance $SiN_x$, relative to gas such as water content or oxygen are arranged on both the surfaces of the panel substrate 12 composed of polyethylene terephthalate (PET) with the thickness of, for example, 100 $\mu$m. The gas barrier films 21 are disposed on both the surfaces of the panel substrate 12 so that the water content or oxygen can be prevented from entering the element and the deterioration of the organic EL materials can be avoided. Further, the gas barrier films 21 are preferably provided with antireflection characteristics. Since the gas barrier films 21 are provided with the antireflection characteristics, so that the reflection of generated light can be suppressed on the panel substrate 12 and the excellent organic EL display 11 with high transmittance can be configured.

Figure 8:
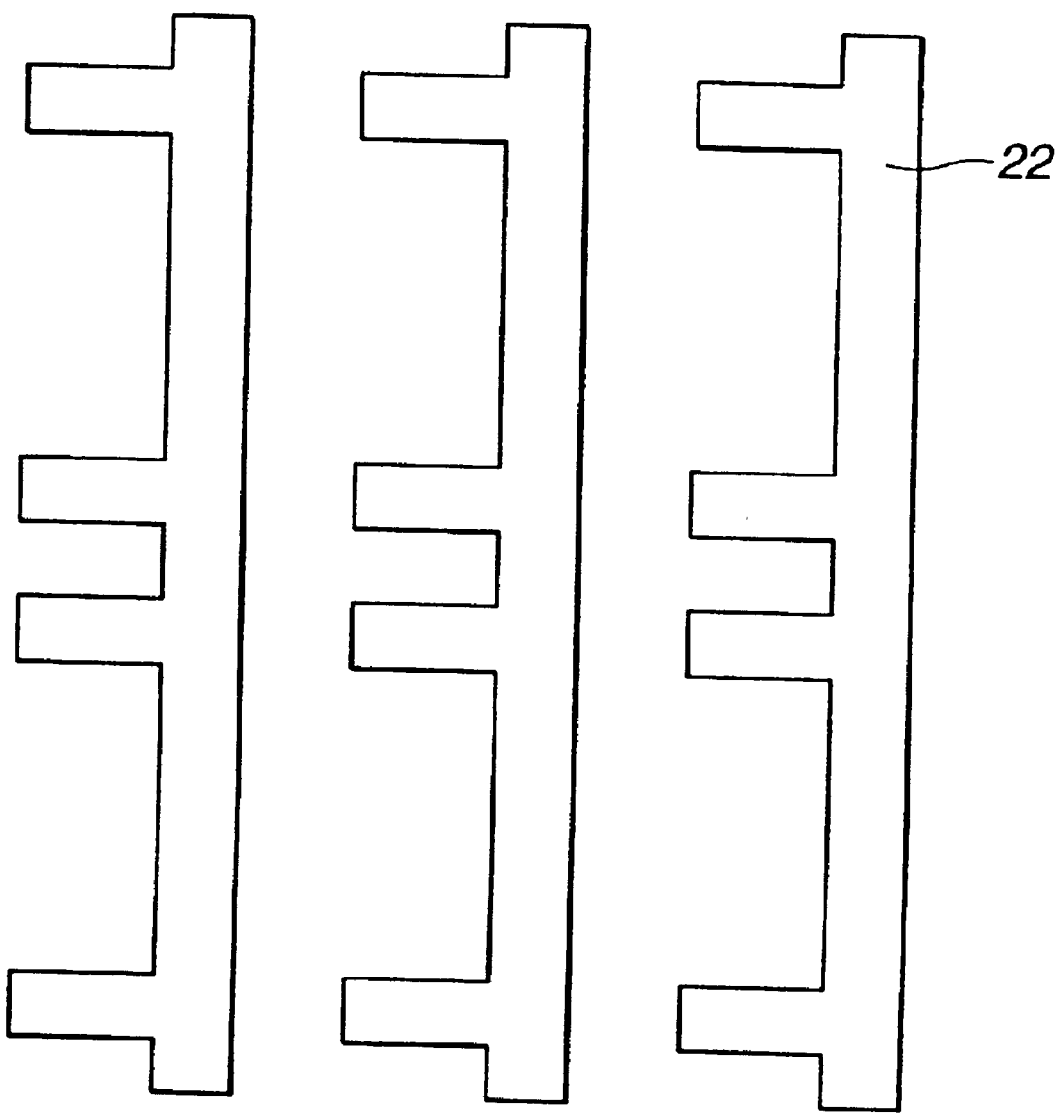
FIG. 8 is a plan view showing one example of a form of an electrode film shown in FIG. 7.
Figure 9:
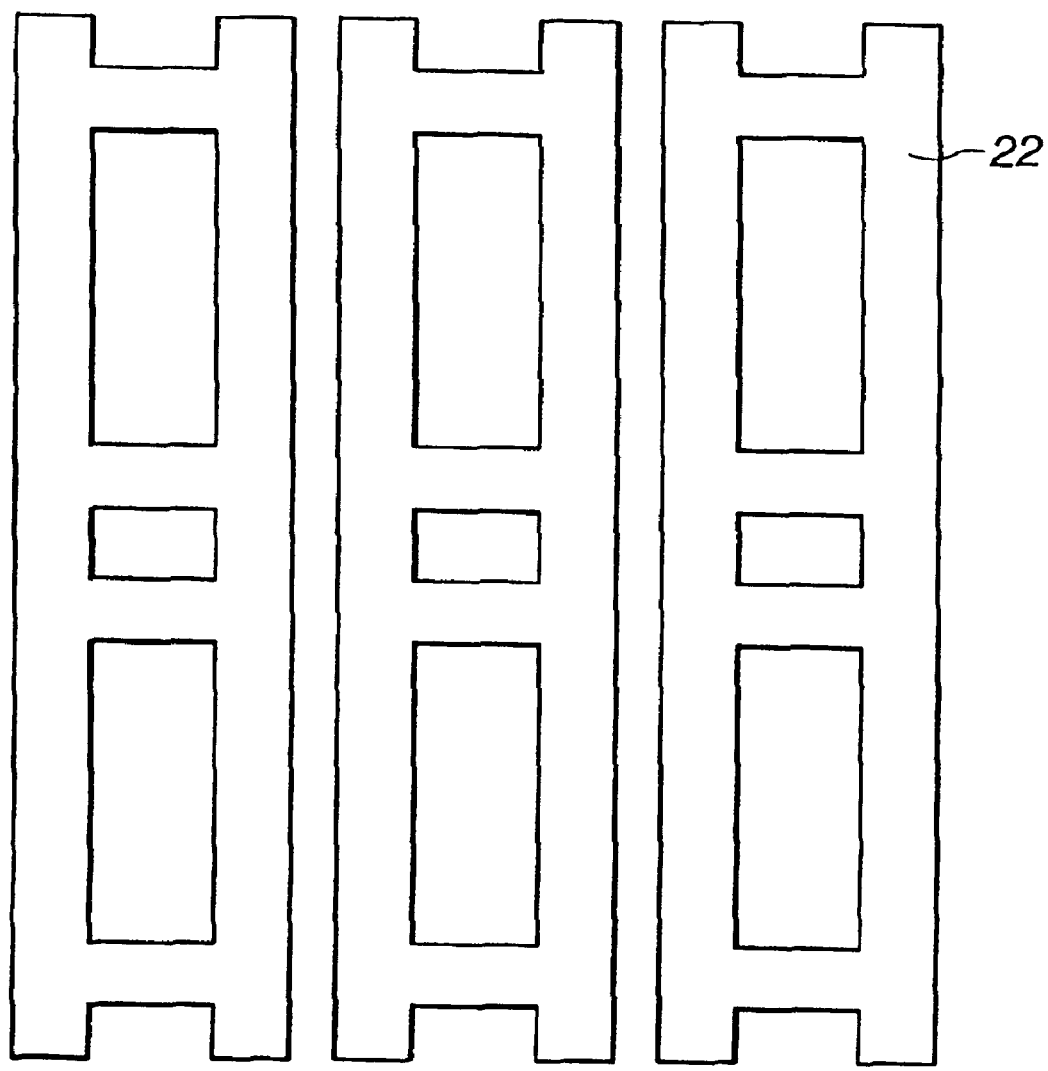
FIG. 9 is a plan view showing one example of a form of the electrode film shown in FIG. 7.

The electrode film 22 is formed on the panel substrate 12 in, for example, what is called a comb shape as shown in FIG. 8, or for example, what is called a ladder shape as shown in FIG. 9. The electrode film 22 is connected to a first electrode 28 passing through the first insulating film 24 and the second insulating film 27. The first electrode 28 serves as an external anode of the organic EL element 20. That is, the electrode film 22 serves as an auxiliary electrode for supplying an electric current to the transparent electrode film 23 formed on the electrode film 22.

Here, when the organic EL elements 20 are used as the display elements to form the organic EL display 11, the driving circuits for driving the organic EL elements need to be arranged in the side parts of the elements in the conventional passive matrix system display, which has caused the display to be enlarged with difficulty because of a reason of voltage drop due to the wiring resistance of the driving circuits.

In the organic EL element 20, since the first electrode 28 and a second electrode 29 described below serving as a terminal for externally introducing a current pass through the first insulating film 24 or second insulating film 27 and are exposed on a surface opposite to the panel substrate 12, so that the driving circuit for driving the organic EL element 20 is not arranged from the side of the element and can be arrange on the back surface of the element. Therefore, in the organic EL display 11 using the organic EL elements 20, since such a problem as the voltage drop due to the wiring resistance of the driving circuit is not generated, the organic EL display 11 can be enlarged.

Figure 10:
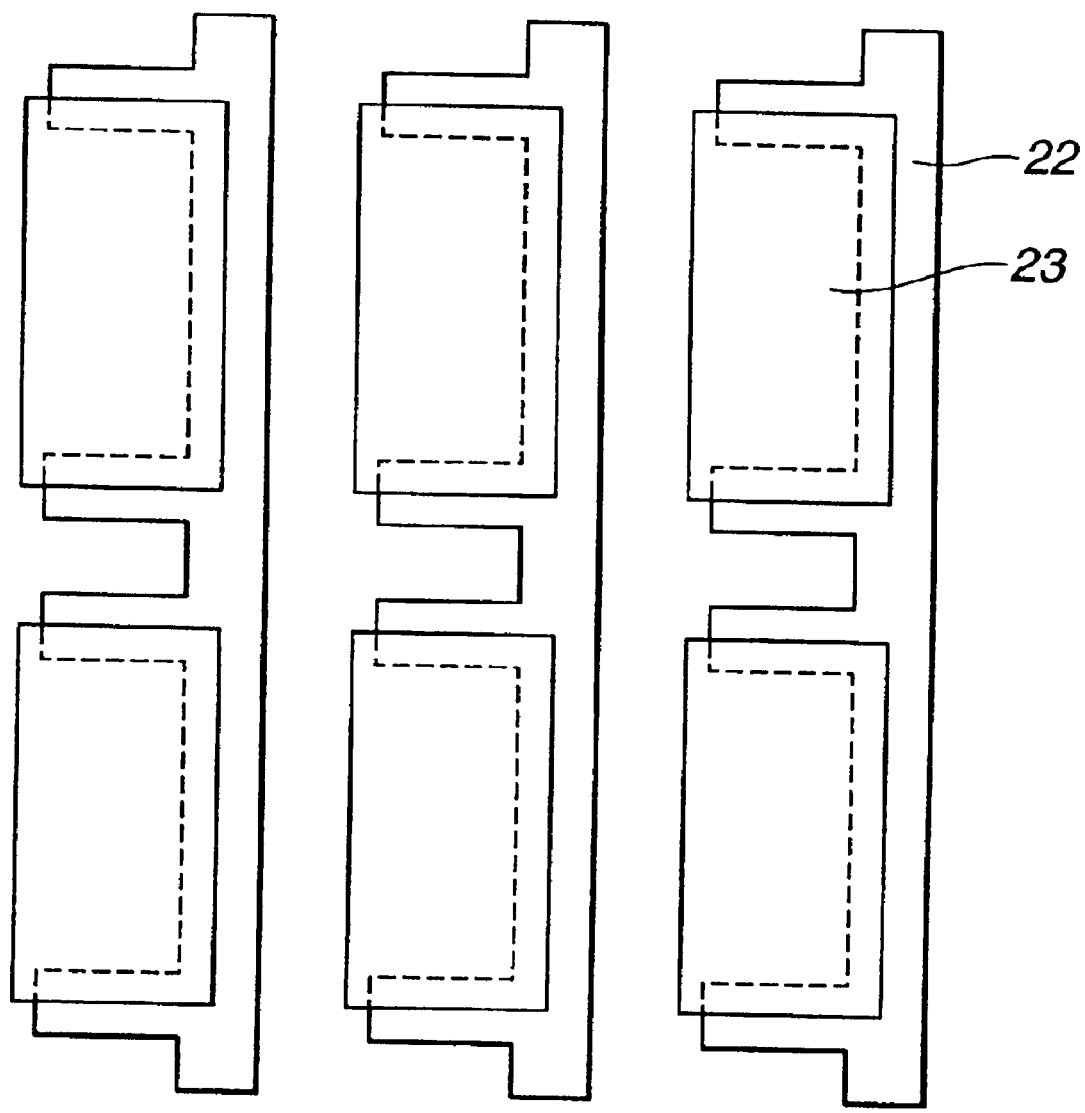
FIG. 10 is a plan view showing one example of a transparent electrode film formed on the electrode film shown in FIG. 8.
Figure 11:
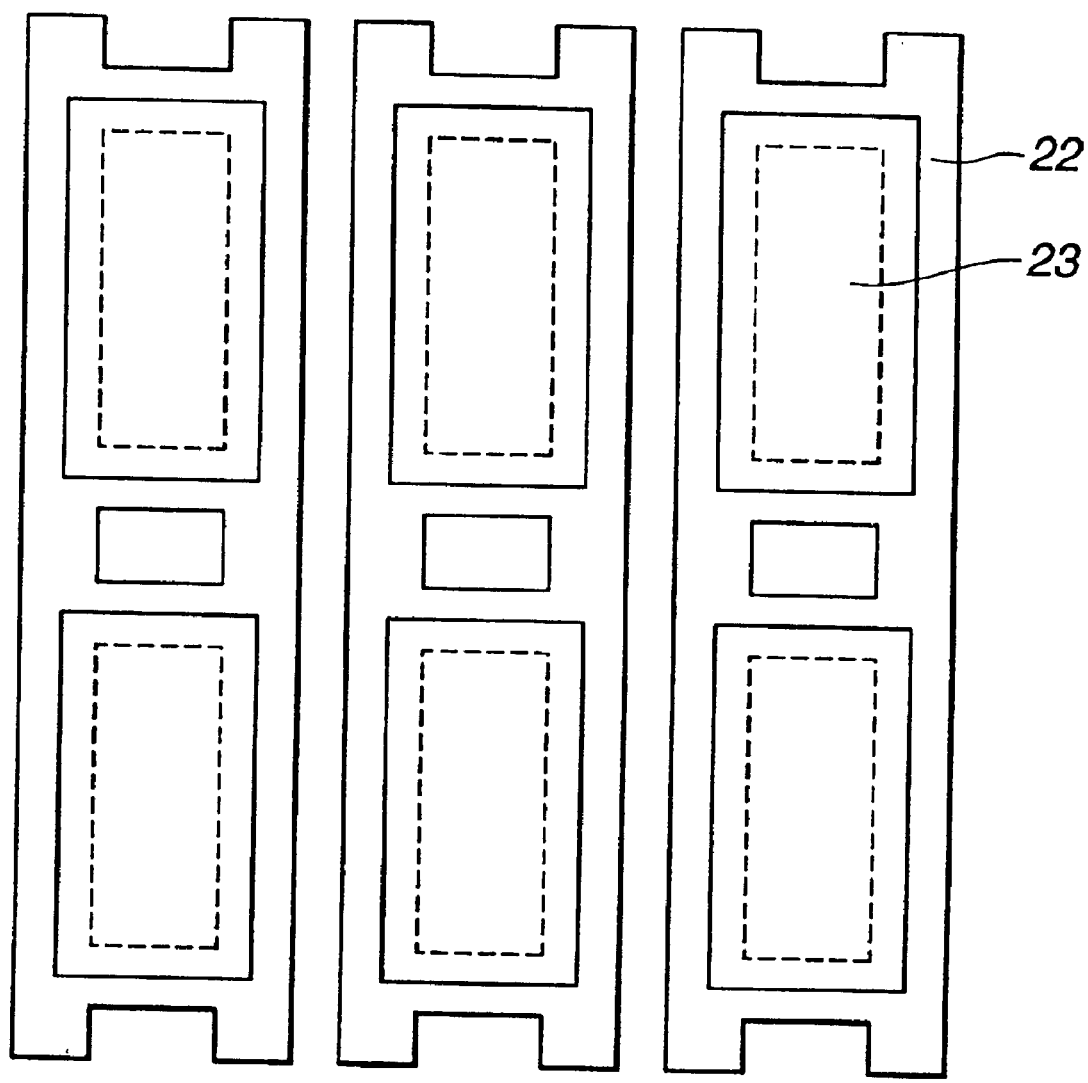
FIG. 11 is a plan view showing one example of a transparent electrode film formed on the electrode film shown in FIG. 9.

The transparent electrode film 23 serves as an anode of the organic EL element 20 and is made of ITO (indium tin oxide) with the thickness of, for instance, 100 nm. The transparent electrode film 23 is formed in an island shape on the opening part of the electrode film 22 formed in the comb shape or the ladder shape, as shown in FIG. 10 or FIG. 11, and connected to the first electrode 28 through the electrode film 22.

The first insulating film 24 having an opening part 24a is formed on the transparent electrode film 23. This first insulating film 24 serves as a barrier plate for separating one element from another element.

The opening of the opening part 24a in the first insulating film 24 has what is called a regularly tapered form that the opening becomes large as it is separate from the transparent electrode film 23. In the case where the first insulating film 24 has not a tapered shape, when an electric current is supplied to drive the organic EL element 20, an electric field is undesirably concentrated on the ends of the transparent electrode film 23, the organic EL film 25 and the metal electrode film 26 so that an insulation may be possibly broken to cause a short-circuit between the transparent electrode film 23 and the metal electrode film 26. The first insulating film 24 is formed in the regularly tapered shape, and accordingly, the transparent electrode film 23, the organic EL film 25 and the metal electrode film 26 can be isolated therebetween and the short-circuit between the transparent electrode film 23 and the metal electrode film 26 due to the concentration of electric field to the ends of the transparent electrode film 23, the organic EL film 25 and the metal electrode film 26 can be prevented.

As the material of the first insulating film 24, for instance, SiN or the like may be employed. The SiN has not only an insulating property, but also a gas barrier function relative to water content or oxygen. The first insulating film 24 is provided with the gas barrier function so that the water content or oxygen can be prevented from entering the element and the deterioration of the organic EL film 25 can be prevented.

The organic EL film 25 is formed on the transparent electrode film 23 exposed from the opening part 24a of the first insulating film 24 with the thickness of, for example, 150 nm so as to be larger than the opening part 24a and extend on the first insulating film 24. The organic EL film 25 is formed by laminating a hole transport layer, an emission layer and an electron transport layer. When the electric current is applied to a part between the transparent electrode film 23 (anode) and the metal electrode film 26 (cathode), a positive hole injected from the metal electrode film 26 reaches the emission layer via the hole transport layer, and an electron injected from the transparent electrode film 23 reaches the emission layer via the electron transport layer, respectively. Then, the electron-hole recombination is generated in the emission layer. At this time, light having a prescribed wavelength is generated. This light outgoes from the side of the panel substrate 12.

The metal electrode film 26 is made of, for instance, MgAg or AlLi and serves as a cathode of the organic EL element 20. The metal electrode film 26 is formed on the organic EL film 25 so as to be larger than the organic EL film 25, and have the thickness of, for instance, 200 nm. The metal electrode film 26 is connected to the second electrode 29 passing through the second insulating film 27.

The second insulating film 27 is formed over the entire surface of the element so as to have the thickness of, for instance, 1000 nm. As materials of the second insulating film 27, for instance SiN, AlN or the like may be exemplified. The second insulating film 27 has not only insulating characteristics, but also a gas barrier function relative to water content or oxygen. The second insulating film 27 is provided with the gas barrier function so that the entry of the water content or oxygen into the element can be prevented and the deterioration of the organic EL film 25 can be prevented.

The second electrode 29 is made of aluminum or the like. The second electrode 29 passes through the second insulating film 27 and is connected to the metal electrode film 26 to serve as an external cathode of the organic EL element 20. The second electrode 29 is taken out from the back side of the display screen like the above described first electrode 28 so that the organic EL display 11 using the organic EL elements 20 can be enlarged. Further, the second electrode 29 also has a gas barrier function relative to water content or oxygen. The second electrode 29 is provided with the gas barrier function, and accordingly, the entry of the water content or oxygen into the elements can be prevented and the deterioration of the organic EL film 25 can be prevented.

These first and second electrodes 28 and 29 are connected to the data line terminal 30 and/or the scan line terminal 31 respectively provided on the driving circuit substrate 13 by means of bumps or the like, as shown in FIG. 12. Then, a driving current is supplied from the driving circuit substrate 13 to drive the organic EL element 20. On the driving circuit substrate 13, a driving circuit semiconductor element 32 or the like is mounted.

As described above, in the organic EL element 20, the organic EL film 25 is sealed from both sides by the gas barrier film 21 and the first insulating film 24, and the metal electrode film 26 and the second insulating film 27 which are respectively provided with the gas barrier property, hence the water content or oxygen can be substantially prevented from entering the element and the deterioration of the organic EL film 25 can be suppressed.

Further, in the organic El element 20, the configuration films themselves for forming the organic EL element 20 are provided with the gas barrier property, the configuration of the element can be more simplified than that of the conventional organic EL element which are entirely externally sealed. Further, the manufacturing process of the organic EL element 20 can be more simplified than that of the conventional organic EL element.

Then, in order to drive the organic EL display 11 having the organic EL elements 20, the first electrode 28 and the second electrode 29 are respectively connected to the data line terminal 30 and/or the scan line terminal 31 provided in the driving circuit substrate 13 on which the driving circuit semiconductor element 32 or the like is mounted by means of bumps or the like. Here, as the driving circuit substrate, one large driving circuit substrate with which the entire surface of the panel substrate 12 is covered is not disposed, but a plurality of driving circuit substrates 13a to 13f corresponding to the finely divided driving circuit areas S11 to S16 in the panel substrate 12.

In the organic EL element 20, since the electrode terminals are taken out not from the side part of the display screen, but from the back side thereof, the driving circuit substrate 13 for driving the organic EL element 20 can be disposed on the back surface of the element so that the organic EL display 11 can be enlarged.

Then, a plurality of driving circuit substrates 13a to 13f mounted on the back side of the panel substrate 12 are connected together by a cascade connection manner and the image transfer device 14 is externally connected as shown in FIG. 6. Then, an image signal or a video signal is transmitted to the driving circuit substrates 13a to 13f from the image transfer device 14. The driving circuit substrates 13a to 13f supply a driving current to the organic EL elements 20 in accordance with the image signal or the video signal to drive the organic EL elements 20 and display an image or a screen image on the display screen of the organic EL display 11. In the organic EL display 11, the driving circuit area and the driving circuit substrate are finely divided so that the length of the driving wires is reduced. Even when the screen is enlarged, the voltage drop due to the wiring resistance of the wires is eliminated to stably drive the organic EL elements 20.

Further, the panel substrate 12 on which the organic EL elements 20 are formed in a passive matrix system is cut so as to meet the finely divided passive matrix and the number of driving circuit substrates 13 corresponding to that of the cut matrix are joined and connected together on the back surface, and accordingly, the displays of different size can be manufactured by the same film forming method. Thus, the large display employing the passive matrix system can be manufactured without using a semiconductor process such as the TFT (thin film transistor). Accordingly, a manufacturing cost can be lowered and the large display of low cost can be realized.

In the above described embodiments, although the organic EL elements are used as the display elements in the organic EL display, it is to be noted that the present invention is not limited thereto and the display elements may be applied to an inorganic EL display using inorganic EL elements as the display elements, a liquid crystal display using a liquid crystal as a display element, an LED display using a light emitting diode (LED) as a display element and a plasma display.

As described above, according to the present invention, the display device comprises a display part having a flexible panel substrate serving as a display screen and display elements disposed lengthwise and breadthwise on a surface opposite to the display screen of the panel substrate; and driving circuit parts having flexible driving circuit substrates on which semiconductor elements made of flexible semiconductor materials are mounted.

In the display device according to the present invention configured as described above, the display part is provided with the display elements on the flexible panel substrate. Thus, in the display device, the display part can be made flexible.

Further, in the display device, the driving circuit parts are provided with the flexible driving circuit substrates on which the flexible semiconductor elements formed of the flexible semiconductor materials are mounted: Thus, in this display device, the driving circuit parts are considered to be flexible.

Therefore, since both the display part and the driving circuit parts are flexible in the display device according to the present invention, the entire body of the display device can be made completely flexible.

Further, according to the present invention, the completely flexible display device in which not only the display part, but also the driving circuit parts are flexible can be provided.

What is claimed is:

1. A display device comprising:
   a display part having a flexible panel substrate serving as a display screen and display elements disposed lengthwise and breadthwise on a surface opposite to the display screen of the panel substrate; and
   driving circuit parts having flexible driving circuit substrates on which semiconductor elements made of flexible semiconductor materials are mounted.

2. The display device according to claim 1, wherein the flexible semiconductor material is an organic semiconductor material.

3. The display device according to claim 2, wherein the organic semiconductor material is pentacene.

4. The display device according to claim 2, wherein the organic semiconductor material is polyacetylene.

5. The display device according to claim 1, wherein the display part is connected to the driving circuit parts by flexible cables.

6. The display device according to claim 1, wherein the area in the panel substrate on which the display elements are disposed is finely divided into a plurality of areas by driving wires for driving the display elements and a plurality of driving circuit substrates are arranged respectively so as to correspond to the areas.

7. The display device according to claim 6, wherein the driving circuit substrates are arranged in the side of the panel substrate on which the display elements are disposed and are connected through bumps to the display elements by terminals.

8. The display device according to claim 6, wherein a plurality of driving circuit substrates are joined by cascade connection and the display elements are driven in accordance with an image signal supplied from a signal supply device.

9. The display device according to claim 1, wherein the display elements are arranged in a passive matrix.

10. The display device according to claim 1, wherein the display elements are arranged in an active matrix.

11. The display device according to claim 1, wherein the display elements are organic electroluminescence elements.

12. The display device according to claim 1, wherein the display elements are inorganic electroluminescence elements.

13. The display device according to claim 1, wherein the display elements are liquid crystal elements.

14. The display device according to claim 1, wherein the driving circuit substrates are film type metal substrates.

15. The display device according to claim 1, wherein the driving circuit substrates are film type plastic substrates.

16. The display device according to claim 15, wherein the film type plastic substrate has a gas barrier layer on its main surface.

17. The display device according to claim 1, wherein the driving circuit substrates are composed of organic semiconductor materials.

18. The display device according to claim 17, wherein the organic semiconductor material is pentacene.

19. The display device according to claim 17, wherein the organic semiconductor material is polyacetylene.

20. The display device according to claim 1, wherein the driving circuit substrate is a sheet type polymer battery.

21. A display device comprising:
    a display part having a flexible panel substrate serving as a display screen and display elements disposed lengthwise and breadthwise on a surface opposite to the display screen of the panel substrate; and
    flexible semiconductor elements made of flexible semiconductor materials which are directly mounted on the side of the panel substrate opposite to the side of the display part on which the display elements are arranged.

22. A display device comprising:
    a flexible panel substrate serving as a display screen;
    driving circuit parts having flexible semiconductor elements made of flexible semiconductor materials on the panel substrate; and
    a display part having display elements disposed lengthwise and breadthwise on the driving circuit parts.

* * * * *